United States Patent
Pennock et al.

(10) Patent No.: US 10,334,339 B2
(45) Date of Patent: Jun. 25, 2019

(54) MEMS TRANSDUCER PACKAGE

(71) Applicant: Cirrus Logic International Semiconductor Ltd., Edinburgh (GB)

(72) Inventors: John Laurence Pennock, Edinburgh (GB); Tsjerk Hoekstra, Balerno (GB); David Talmage Patten, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/538,584

(22) PCT Filed: Dec. 4, 2015

(86) PCT No.: PCT/GB2015/053729
§ 371 (c)(1),
(2) Date: Jun. 21, 2017

(87) PCT Pub. No.: WO2016/102925
PCT Pub. Date: Jun. 30, 2016

(65) Prior Publication Data
US 2017/0374442 A1    Dec. 28, 2017

Related U.S. Application Data

(60) Provisional application No. 62/096,480, filed on Dec. 23, 2014.

(51) Int. Cl.
*H04R 19/00*   (2006.01)
*H04R 1/04*    (2006.01)
(Continued)

(52) U.S. Cl.
CPC ............. *H04R 1/04* (2013.01); *B81B 7/0061* (2013.01); *B81C 1/00309* (2013.01);
(Continued)

(58) Field of Classification Search
CPC ...... H04R 1/04; H04R 1/2853; H04R 19/005; H04R 19/04; H04R 31/003;
(Continued)

(56) References Cited

U.S. PATENT DOCUMENTS 8,983,105 B2 *   3/2015   Reining ................ B81B 7/0061
                                                    381/150
9,006,845 B2 *   4/2015   Dehe .................... B81B 3/0072
                                                    257/415
(Continued)

OTHER PUBLICATIONS

International Search Report and Written Opinion of the International Searching Authority, International Application No. PCT/GB2015/053729, dated Feb. 25, 2016.

*Primary Examiner* — Brian Ensey
(74) *Attorney, Agent, or Firm* — Jackson Walker L.L.P.

(57) ABSTRACT

A MEMS transducer package (1) comprises a semiconductor die element (3) and a cap element (23). The semiconductor die element (3) and cap element (23) have mating surfaces (9, 21). The semiconductor die element (3) and cap element (23) are configured such that when the semiconductor die element (3) and cap element (4) are conjoined, a first volume (7, 27) is formed through the semiconductor die element (3) and into the semiconductor cap element (23), and an acoustic channel is formed to provide an opening between a non-mating surface (11) of the semiconductor die element (3) and a side surface (10, 12) of the transducer package.

20 Claims, 11 Drawing Sheets

(51) Int. Cl.
  *H04R 1/28* (2006.01)
  *H04R 19/04* (2006.01)
  *H04R 31/00* (2006.01)
  *B81B 7/00* (2006.01)
  *B81C 1/00* (2006.01)
  *H04R 1/34* (2006.01)

(52) U.S. Cl.
  CPC ......... *H04R 1/2853* (2013.01); *H04R 19/005* (2013.01); *H04R 19/04* (2013.01); *H04R 31/00* (2013.01); *H04R 31/003* (2013.01); *B81B 2201/0257* (2013.01); *B81B 2207/015* (2013.01); *H04R 1/342* (2013.01); *H04R 2201/003* (2013.01); *H04R 2410/07* (2013.01)

(58) Field of Classification Search
  CPC .............. H04R 2410/07; B81B 7/0061; B81B 2201/0257; B81B 2207/015; B81C 1/00309
  See application file for complete search history.

(56) References Cited

U.S. PATENT DOCUMENTS

| | | |
|---|---|---|
| 2006/0140431 A1 | 6/2006 | Zurek |
| 2013/0051598 A1 | 2/2013 | Reining |
| 2013/0147040 A1* | 6/2013 | Ochs ....................... B81B 7/007 257/738 |
| 2014/0197501 A1 | 7/2014 | Dehe |
| 2014/0341402 A1 | 11/2014 | Traynor et al. |

\* cited by examiner

MEMS TRANSDUCER PACKAGE

TECHNICAL FIELD

The present application relates to a Micro-electromechanical-system (MEMS) transducer package, for example a MEMS microphone package (including a Capacitive-type MEMS transducer, a Piezo-type MEMS transducer, or an Optical-type microphone), and to a semiconductor die portion and cap portion for use in a MEMS transducer package.

BACKGROUND

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, personal digital assistants (PDAs), various wearable devices, mobile computing platforms such as laptop computers or tablets and/or games devices. Requirements of the mobile phone industry for example, are driving the components to become smaller with higher functionality and reduced cost. It is therefore desirable to integrate functions of electronic circuits together and combine them with transducer devices such as microphones and speakers.

Micro-electromechanical-system (MEMS) transducers, such as MEMS microphones are finding application in many of these devices. There is therefore also a continual drive to reduce the size and cost of the MEMS devices.

Microphone devices formed using MEMS fabrication processes typically comprise one or more membranes with electrodes for read-out/drive that are deposited on or within the membranes and/or a substrate or back-plate. In the case of MEMS pressure sensors and microphones, the electrical output signal is usually obtained by measuring a signal related to the capacitance between the electrodes. However in some cases the output signal may be derived by monitoring piezo-resistive or piezo-electric elements. In the case of capacitive output transducers, the membrane is moved by electrostatic forces generated by varying a potential difference applied across the electrodes, though in some other output transducers piezo-electric elements may be manufactured using MEMS techniques and stimulated to cause motion in flexible members.

To provide protection, the MEMS transducer may be contained within a package. The package effectively encloses the MEMS transducer and can provide environmental protection while permitting the physical input signal to access the transducer and providing external connections for the electrical output signal.

FIG. 1a illustrates one conventional MEMS microphone package 100a. A MEMS transducer 101 is attached to a first surface of a package substrate 102. The MEMS transducer 101 may typically be formed on a semiconductor die by known MEMS fabrication techniques. The package substrate 102 may be silicon or a printed circuit board (PCB) or a ceramic laminate or any other suitable material. A cover 103 is located over the transducer 101 attached to the first surface of the package substrate 102. The cover 103 may be a metallic lid. An aperture, i.e. hole, 104 in the cover 103 provides a sound port and allows acoustic signals to enter the package. In this example, the transducer 101 is wire bonded from bond pads 105 on the transducer to bond pads 105a on the package substrate 102. Electrical pathways in or on the substrate connect between the bond pads on the internal face of the substrate and lead, i.e. solder, pads 108 on the external face of the substrate to provide an external electrical connection to the transducer.

The sound port, or acoustic port, 104 allows transmission of sound waves to/from the transducer within the package. The transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port 104 acoustically couples to a first volume on one side of the transducer membrane, which may sometimes be referred to as a front volume. The second volume, sometimes referred to as a back volume, on the other side of the one of more membranes, is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths such as bleed holes, i.e. small holes in the membrane, that are configured so as to present a relatively high acoustic impedance at the desired acoustic frequencies but which allow for low-frequency pressure equalisation between the two volumes to account for pressure differentials due to temperature changes or the like).

FIG. 1b illustrates another known MEMS transducer package 100b. Again, a transducer 101, which may be a MEMS microphone, is attached to the first surface of a package substrate 102. In this example, the package 100b also contains an integrated circuit 106, which although not illustrated may also be present in FIG. 1a. The integrated circuit 106 may be provided for operation of the transducer and may, for example, be a low-noise amplifier for amplifying the signal from a MEMS microphone. The integrated circuit 106 is electrically connected to electrodes of the transducer 101 and is also attached to the first surface of the package substrate 102. The integrated circuit 106 is electrically connected to the transducer 101 via wire-bonding. A cover 107 is located on the package substrate so as to enclose the transducer 101 and the integrated circuit 106. In this package, the cover 107 is a two-piece cover that comprises an upper part or lid portion 107a and a spacer or frame portion 107b surrounding a cavity in which the transducer 101 and the integrated circuit 106 are situated. The package substrate 102, cover and frame portion may all be formed of PCB or ceramic material which may be multi-layer laminate structures. The cover 107 has a sound port 104 in the upper part 107a which allows acoustic signals to enter the package. Each of the substrates in FIGS. 1a and 1b have external lead pads, i.e. solder pads, 108 for external connection to an end user's PCB via a solder reflow process for example.

In order to buffer the generally weak transducer output signal, an integrated circuit amplifier circuit may also be used in the packages similar to that shown in FIG. 1a and connected internally in similar fashion to that shown in FIG. 1b. In some examples, the acoustic port may be provided through the substrate 102 rather than the cover, or sometimes in both to provide a differential or directional microphone.

Various other styles of packages for MEMS microphone and other MEMS transducers are available, but may be complex multi-part assemblies and/or require physical clearance around the transducer for connections, impacting material and manufacturing cost and physical size.

The embodiments disclosed herein relate to improved MEMS transducer packages.

SUMMARY

According to a first aspect of the present invention, there is provided a MEMS transducer package comprising a semiconductor die portion having a thickness bounded by a first surface and an opposite second surface, and a transducer element incorporated in the second surface. A die back volume extends through the thickness of the semiconductor die portion between the first surface and the transducer element. An acoustic die channel extends into the semiconductor die portion between the second surface and a side surface of the semiconductor die portion.

In one embodiment the acoustic die channel forms a channel in the second surface of the semiconductor die portion, wherein the channel extends inwardly from an opening formed by the channel in the side surface of the semiconductor die portion.

In one embodiment, the acoustic die channel breaches the second surface and the side surface of the semiconductor die portion to form openings therein.

An opening formed in the second surface and an opening formed in the side surface may combine to form an opening which spans an intersection of the second surface and side surface.

In one embodiment a MEMS transducer package further comprises an acoustic seal formed on the second surface of the semiconductor die portion.

The acoustic seal may be configured to channel acoustic signals, during use, from an opening in the side surface of the MEMS transducer package to the transducer element.

The acoustic seal may be configured to surround an opening of the die back volume, and partially surround the acoustic die channel.

In one embodiment, the acoustic seal comprises an interruption therein, the interruption corresponding to a region comprising an opening formed by the acoustic die channel in the second surface of the semiconductor die portion.

In one embodiment, the acoustic seal comprises an interruption therein, the interruption abutting an opening formed by the acoustic die channel in the second surface of the semiconductor die portion.

The acoustic seal may comprise one or more of the following features or properties: a solder ring, for coupling with a corresponding solder ring on a substrate onto which the MEMS transducer package is to be mounted during use; a conductive material; a non-conductive material; a resilient material; a flexible material; or a stress relieving material.

A MEMS transducer package may further comprise a cap portion that abuts the semiconductor die portion.

The cap portion may comprises a thin film, or a die adhesive film.

In another embodiment the cap portion comprises a thickness bounded by a first surface and a second surface, and wherein the cap portion comprises a cap back volume, the cap back volume extending from the second surface of the cap portion partially into the thickness of the cap portion.

A footprint of a cap portion may be the same size as the footprint of the semiconductor die portion.

The cap portion may comprise a semiconductor layer, a silicon layer, a molded plastic layer.

In one embodiment the die back volume comprises a stepped back volume. The stepped back volume may comprise at least one discontinuity along a sidewall of the die back volume, between the first surface and the second surface of the semiconductor die portion.

The stepped back volume may comprise a first sub-volume adjacent to the first surface of the semiconductor die portion and a second sub-volume adjacent to the second surface of the semiconductor die portion. A lateral dimension of the first sub-volume may be greater that the lateral dimension of the second sub-volume. A lateral dimension of the die back volume and a lateral dimension of the cap back volume may be the same size at a plane where they meet.

A cap back volume may comprise a stepped back volume.

According to another aspect, the semiconductor die portion may further comprise integrated electronic circuitry for operating the MEMS transducer element. At least part of the integrated electronic circuitry may be positioned in a thickness of the semiconductor die portion that is bounded by at least part of a first sub-volume of a stepped die back volume and a second surface of the semiconductor die portion.

In one embodiment, a second acoustic channel may be provided. The second acoustic channel may be configured to provide an acoustic path between a third opening in the second surface of the semiconductor die portion and a fourth opening that is in acoustic connection with the die back volume. The second acoustic channel may comprise a first portion which extends between the first surface and the second surface of the semiconductor die portion, and a second portion which extends orthogonal to the first portion, and wherein the first portion and the second portion cooperate to provide an acoustic path between the third opening in the second surface of the semiconductor die portion and the fourth opening that is acoustically coupled to the die back volume.

The fourth opening may be formed either entirely in direct acoustic connection with the cap back volume of the cap portion, or partly in direct acoustic connection with the cap back volume of the cap portion and partly in direct acoustic connection with the die back volume of the semiconductor die portion, or entirely in direct acoustic connection with the die back volume of the semiconductor die portion.

The transducer element may comprise a microphone, or multiple microphones, or where the transducer element comprises a membrane and back-plate, or multiple membranes and back-plates.

According to another embodiment, there is provided a MEMS transducer package comprising: a semiconductor die element; and a cap element; wherein the semiconductor die element and cap element have mating surfaces, wherein the semiconductor die element and cap element are configured such that when the semiconductor die element and cap element are conjoined: a first volume is formed through the semiconductor die element and into the semiconductor cap element; and an acoustic channel is formed to provide an opening between a non-mating surface of the semiconductor die element and a side surface of the semiconductor die element.

According to another embodiment, there is provided a MEMS transducer package comprising: a semiconductor die portion having a thickness bounded by a first surface and an opposite second surface; a transducer element incorporated in the second surface; a die back volume that extends through the thickness of the semiconductor die portion between the first surface and the transducer element; wherein an acoustic die channel is formed in the second surface of the semiconductor die portion, wherein the acoustic die channel forms an opening in the second surface which runs from a boundary of the second surface to within the boundary of the second surface.

According to another embodiment, there is provided a method of fabricating a MEMS transducer package comprising a semiconductor die portion having a thickness bounded by a first surface and an opposite second surface.

The method comprises forming a transducer element in the second surface; etching from the side of the first surface a die back volume that extends through the thickness of the semiconductor die portion between the first surface and the transducer element; and etching from the second surface an acoustic die channel that extends into the thickness of the semiconductor die portion to form a channel that extends from a side surface of the semiconductor die portion into the body of the semiconductor die portion.

BRIEF DESCRIPTION OF DRAWINGS

For a better understanding of the present invention, and to show more clearly how it may be put into effect, reference will now be made, by way of example, to the accompanying drawings, in which:

FIG. 3b illustrates a cross-sectional plan view of the MEMS transducer package according to the example of FIG. 3a;

DESCRIPTION

Figure 1A:
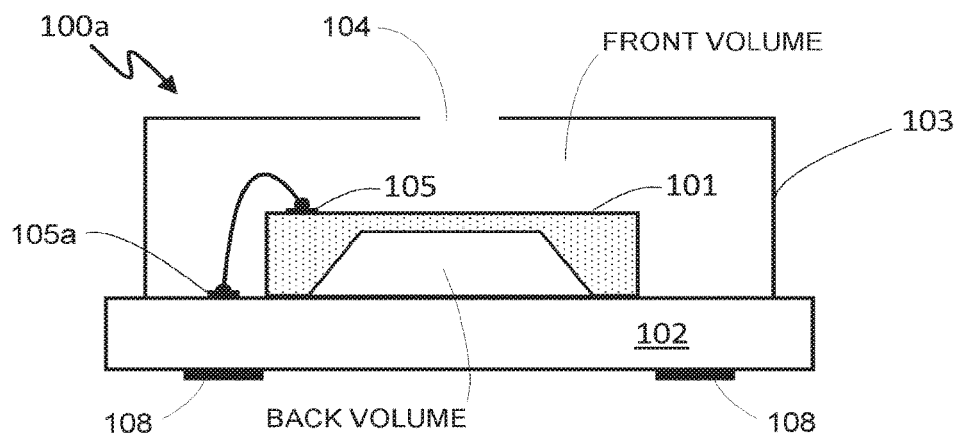
FIGS. 1a and 1b illustrate prior art MEMS transducer packages.
Figure 1B:
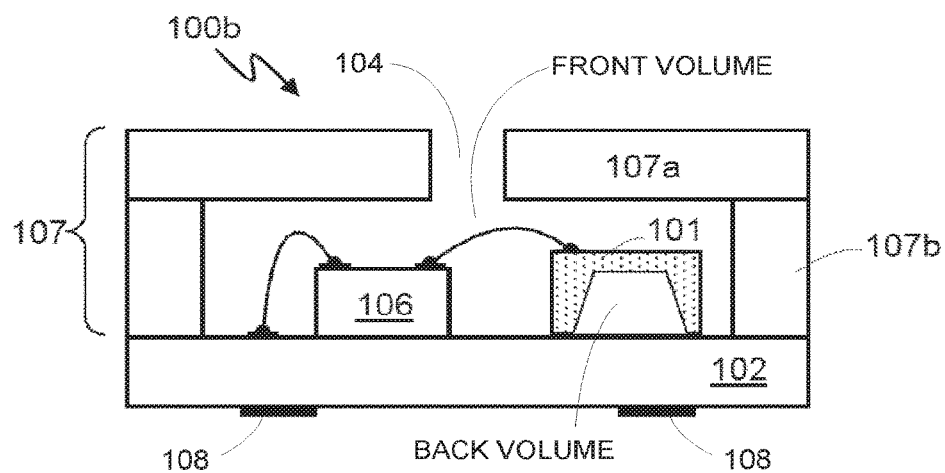

Embodiments of the present disclosure provide improved MEMS transducer packages wherein a die portion comprising a MEMS transducer, and in some embodiments a cap portion, comprise one or more acoustic channels and thus enable a MEMS transducer to be packaged more efficiently. In some embodiments, the die portion may comprise co-integrated electronic circuitry for operation of the MEMS transducer. In some embodiments, the size of a MEMS transducer package may be relatively small and/or reduced as compared to conventional packages and in some embodiments the footprint of the package may be substantially the same size as the footprint of the die portion comprising the MEMS transducer rather than being increased by some surrounding structure.

Throughout this description any features which are similar to features in other figures have been given the same reference numerals.

Lower Side Port Embodiments

Figure 2A:
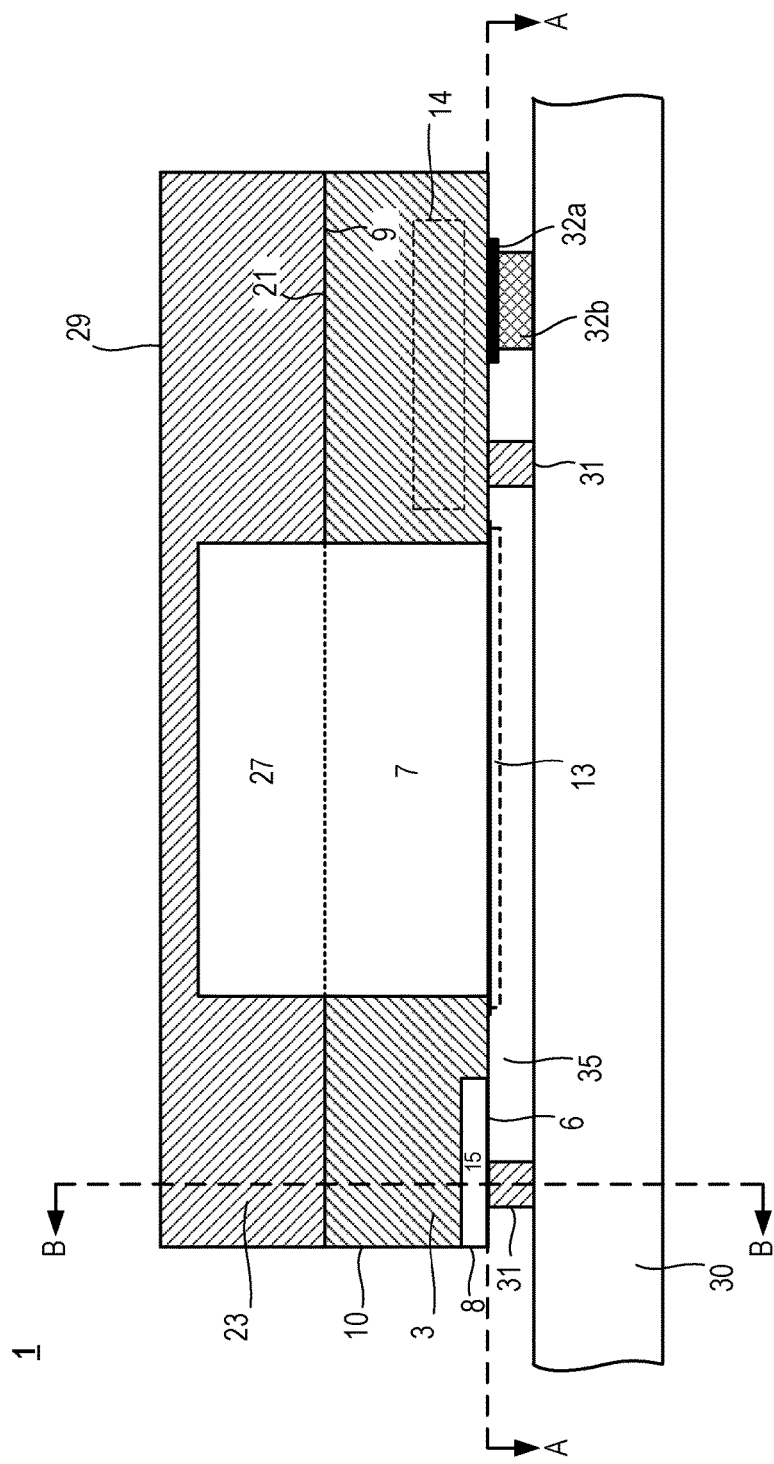
FIG. 2a illustrates a cross-sectional side view of an example of a MEMS transducer package according to an embodiment of the present disclosure.

FIG. 2a shows a cross-sectional side view of an example of a MEMS transducer package 1 according to an embodiment of the present disclosure. The MEMS transducer package 1 is shown as being mounted on a host substrate 30, for example a printed circuit board (PCB) within a device (for example a mobile phone device). In the example of FIG. 2a, the semiconductor die portion 3 is used in conjunction with a cap portion 23 to form the MEMS transducer package 1. The semiconductor die portion 3 comprises a thickness bounded by a first surface 9 and an opposite second surface 11. The second surface 11 of the semiconductor die portion 3 incorporates a transducer element 13 (for example a microphone comprising a membrane and a back-plate). A die back volume 7 extends through the thickness of the semiconductor die portion 3 between the first surface 9 and the transducer element 13. An acoustic die channel 15 extends into the semiconductor die portion 3 between the second surface 11 and a side surface 10 of the semiconductor die portion 3.

In one example the acoustic die channel 15 forms a channel in the second surface 11 of the semiconductor die portion 3, wherein the channel extends inwardly from an opening 8 in the side surface 10 of the semiconductor die portion 3.

In one example the acoustic die channel 15 breaches the second surface 11 and the side surface 10 of the semiconductor die portion 3 to form one or more openings therein.

A first opening 6 formed in the second surface 11 and a second opening 8 formed in the side surface 10 combine to form an opening which spans an intersection of the second surface 11 and side surface 10.

The acoustic die channel 15 may be formed as an etching step on the second surface 11 of the semiconductor die portion, for example when processing the second surface 11 (also referred to as the front side) of the semiconductor die portion 3 when forming the transducer element 13.

In one embodiment, the MEMS transducer package 1 comprises a cap portion 23 as shown in FIG. 2a, wherein the cap portion 23 abuts the semiconductor die portion 3. The cap portion 23 comprises a thickness bounded by a first surface 29 and an opposite second surface 21. The second surface 21 of the cap portion 23 abuts the first surface 9 of the semiconductor die portion 3. Although not shown, the semiconductor die portion 3 and the cap portion 23 may be bonded together, for example using an adhesive or other techniques as generally known in the art of wafer-to-wafer bonding. The semiconductor die portion 3 and cap portion 23 form a MEMS transducer package 1, wherein the cap portion 23 acts to protect the semiconductor die portion 3. Further details of the cap portion 3 will be described later.

The embodiment of FIG. 2a may be referred to as a lower side port configuration, in so far as sound is received from a lower side of the MEMS transducer package 1 when mounted as illustrated. In one example the side 10 of the transducer package, i.e. the side of the die portion 3, is substantially orthogonal to a bottom side of the transducer package 1 (i.e. substantially orthogonal to the bottom side comprising the second surface 11 of the semiconductor die portion 3, which faces the substrate 30). It is noted, however, that the side may also be sloped.

In this example, the MEMS transducer package 1 is shown as comprising an acoustic seal 31. Some or all of the acoustic seal 31 may be formed during fabrication of the semiconductor die portion 3.

The acoustic seal 31 may serve one or more functions. For example, the acoustic seal 31 can function to channel acoustic signals that travel through the acoustic die channel 15 towards the surface of the transducer element 13 via a volume 35 which it seals to prevent leakage of sound pressure laterally between the package 1 and the substrate 30, to prevent leakage away from the transducer element of any sound pressure incident though the acoustic channel, or to prevent the ingress of any sound from other sources.

The acoustic seal 31 may also function to attach the MEMS transducer package 1 to the substrate 30. If made from conductive material, it may also provide a ground connection between metal connections on the package and metal connections on the substrate 30. The package 1 may provide a metal pattern for example a metal ring to enable such a connection to be made onto the user substrate 30. The acoustic seal 31 may comprise a compliant, i.e. flexible, conductive or non-conductive, material and/or structure to reduce mechanical coupling of stress between the substrate 30 and the package 1 and the transducer 13. The seal 31 may comprise a polymer such as silicone or some other type of flexible, i.e. compliant, material such as adhesive rubber etc.

The second surface 11 of the semiconductor die portion may comprise lead, i.e. solder, pads 32a for electrical connection to electrical conductors on the substrate 30 via solder 32b for example. Respective solder pads 32a may be connected via electrical pathways, such as vias and conductive traces (not illustrated), so as to provide power (V+ and ground potentials) to the transducer and to output a signal from the transducer for example: other solder pads and operative connections may be required as needed and as would be understood by those skilled in the art. Advantageously, the solder pads 32a may be formed from the metal layers associated with the formation of the MEMS backplate and membrane metal electrodes or some other MEMS metal processing layer as opposed to the metal layers associated with the processing of the integrated electronic circuitry. Therefore, the solder pads 32b and associated metal, i.e. conductive, traces to/from the transducer, including any electronic circuitry if present, may be considered a re-distribution layer. Therefore a MEMS package as herein described with a metal layer for solder pads 32a formed during the MEMS transducer metal formation is advantageous in re-distributing the solder pads to various areas of the MEMS transducer which may be over the area where the circuitry is formed, if present.

Figure 2B:
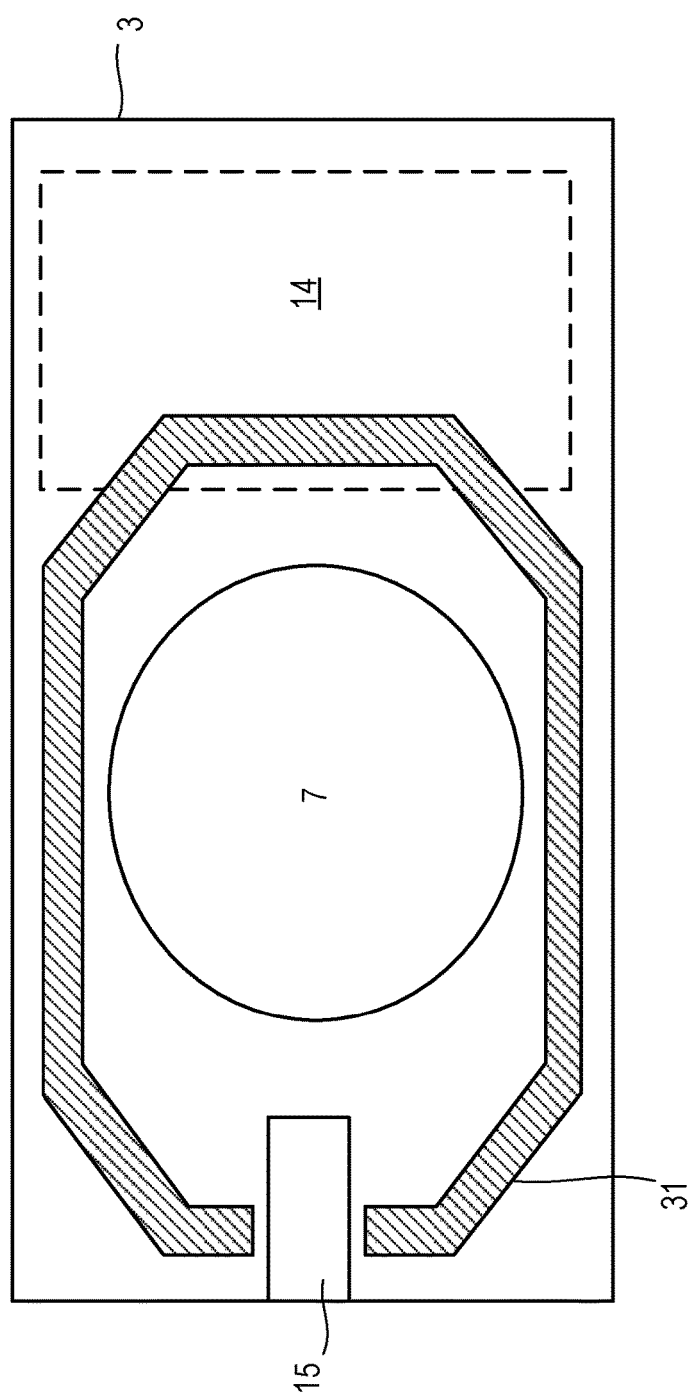
FIG. 2b illustrates a cross-sectional plan view of the MEMS transducer package according to the example of FIG. 2a of the present disclosure.

FIG. 2b is a cross-sectional plan view of the MEMS transducer package of the example of FIG. 2a, the cross section taken through the plane A-A of FIG. 2a (the solder pads 32 having been removed for clarity). In this example the acoustic seal 31 is generally octagonal in outline, but in other examples it might be other shapes, for example square, circular or some more irregular polygon depending on the layout of other structures on the die. In the example of the lower side port configuration of FIG. 2b, the acoustic seal 31 comprises a ring type structure that encloses an opening of the die back volume (and the transducer element 13, and which partially surrounds an opening formed by the acoustic die channel 15 in the second surface 11.

The acoustic seal 31 may be formed on the second surface 11 of the semiconductor die portion 3, for example when forming the transducer element 13.

In one example the acoustic seal 31 is configured to channel acoustic signals, during use, from an opening in the side surface 10 of the MEMS transducer package 1 to the transducer element 13. The acoustic seal 31 may be configured to surround an opening of the die back volume 7, and partially surround the acoustic die channel 15. The acoustic seal 31 may comprise an interruption 31z therein, the interruption 31z corresponding to a region comprising the opening formed by the acoustic die channel 15 in the second surface 11 of the semiconductor die portion 3. In another example, the acoustic seal 31 comprises an interruption 31z therein, the interruption 31z abutting an opening formed by the acoustic die channel 15 in the second surface 11 of the semiconductor die portion 3.

In this way, the acoustic seal 31 acts to channel acoustic signals that travel into the opening formed by the combination of the acoustic die channel 15 and the interruption in the acoustic seal 31, towards the surface of the transducer element 13 via a volume 35 (as shown in FIG. 2a). The acoustic seal 31 seals the volume 35 to the extent that it prevents leakage of sound pressure laterally between the package 1 and the host substrate 30, to prevent leakage away from the transducer element 13 of any sound pressure incident though the acoustic channel 15, and to prevent the ingress of any sound from other sources.

Figure 2C:
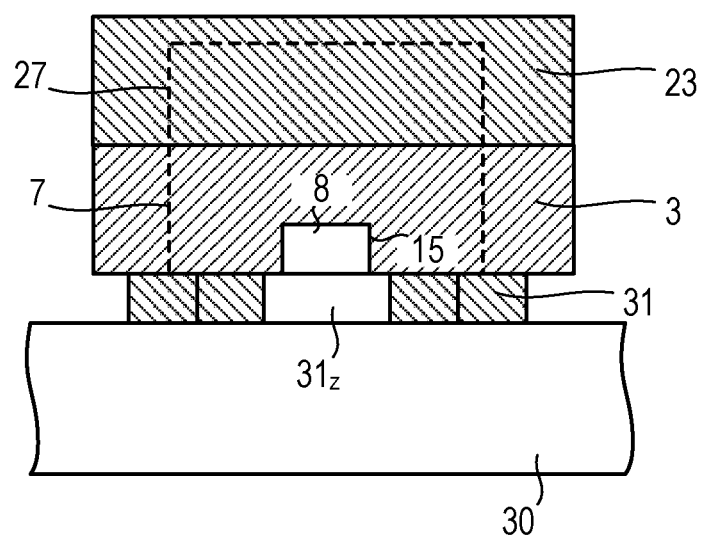
FIG. 2c illustrates a cross-sectional side view of the MEMS transducer package according to the example of FIGS. 2a and 2b of the present disclosure.

FIG. 2c is a cross-sectional side view of the MEMS transducer package of the example of FIG. 2a, the cross section taken through the plane B-B of FIG. 2a.

FIG. 2c shows the opening 8 formed by the acoustic die channel 15 in the side of the semiconductor die portion 3, and the opening 31z formed by the interruption in the acoustic seal 31 near the region of the acoustic die channel 15.

In the example of FIGS. 2a to 2c, the acoustic die channel 15 breaches the second surface 11 and a side surface 10 of the semiconductor die portion 3, to form an opening which spans the intersection of the second surface 11 and side surface 10. The die acoustic channel 15 may be formed, for example, by etching the semiconductor die portion 3 from the second surface 11 into the thickness of the semiconductor die portion 3. Such an etching step may be formed, for example, when forming the transducer element 13 onto the second surface 11 (sometimes referred to as the front-side) of the semiconductor die portion 3.

The acoustic die channel 15 has the advantage of enabling acoustic signals from a side (10) of the MEMS transducer package to reach the transducer element 13 when the MEMS transducer package 1 is used in different assembly or mounting configurations.

It is noted that in the example of FIGS. 2a to 2c, and the other examples described herein, the semiconductor die portion 3 incorporates a transducer element 13 that may be formed using silicon processing techniques, possibly in conjunction with additional processes such as the deposition of piezo-electric or piezo-resistive thin films. Preferably any such transducer processing techniques are compatible in terms of processing temperature and suchlike with providing active circuitry in the same silicon die.

In addition, it is noted that in the example of FIGS. 2a to 2c, and the other examples described herein, the footprint of the cap portion 23 may be the same size as the footprint of the semiconductor die portion 3, or substantially the same size as the semiconductor die portion 3 (for example within 10% of the size of the semiconductor die portion 3).

In the example of FIGS. 2a to 2c, the cap portion 23 is shown as comprising a cap back volume 27, which cooperates with the die back volume 7 to advantageously increase the overall back volume. This can be advantageous in certain embodiments where a greater back volume is desired, or to aid the overall height of a MEMS device to be reduced. It is noted, however, that the cap back volume may be dispensed with in some embodiments.

In the embodiment of FIGS. 2a to 2c, the acoustic die channel 15 together with the sealed volume 35 between the MEMS transducer package 1 and the substrate 30 onto which the MEMS transducer package is mounted, cooperate to provide an acoustic path through which sound or pressure waves can travel from a side surface of the MEMS transducer package (and from a top side of the host substrate 30) to the transducer element 13 (i.e. from the side surface 10 through the acoustic die channel 15 and the volume 35 to the surface of the MEMS transducer element 13).

The embodiment of FIGS. 2a to 2c has an advantage of providing a compact MEMS transducer package which can be entirely formed by wafer-level processing techniques, for example wherein a first semiconductor wafer is used to fabricate a plurality of semiconductor die portions 3, and a second wafer used to fabricate a plurality of cap portions 23, wherein the wafers may be bonded together to form a plurality of MEMS transducer packages, which may then be singulated to form a plurality of individual MEMS transducer packages. The footprint or lateral external dimensions of the package will then just be that of the semiconductor die portion 3 rather than increased by any surrounding structure. The cap portion 23 may naturally be the same footprint as the die portion 3, since the two portions may be singulated together. Alternatively at least some of the height of some of the perimeter of cap portion 23 may comprise side faces inset from the underlying semiconductor die edges by incorporating trenches that are etched prior to singulation in a similar way to etching the acoustic die channel 25 so as to aid the singulation process.

Although not shown in all the diagrams throughout, it is noted that the semiconductor die portion 3 may also comprise integrated electronic circuitry 14.

Figure 3A:
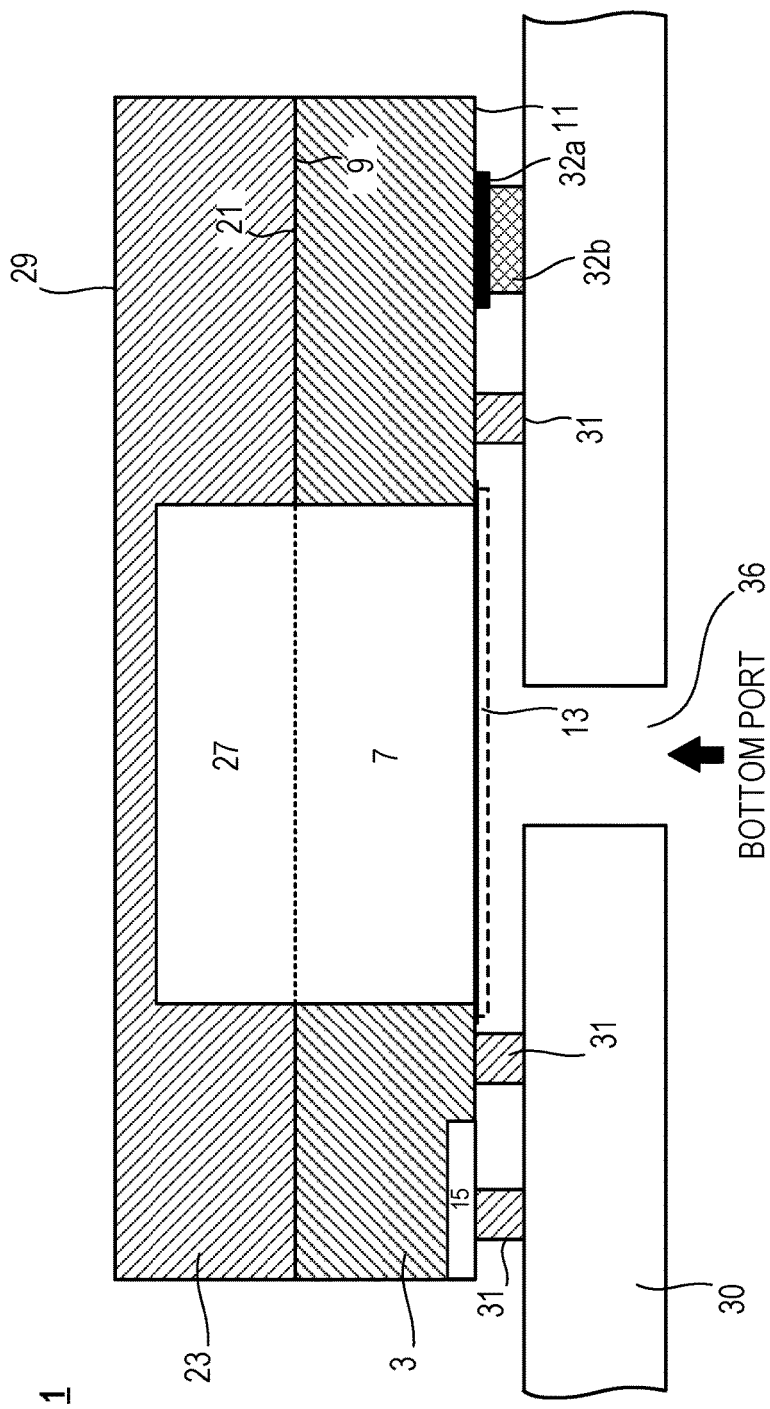
FIG. 3a illustrates a cross-sectional side view of an example of a MEMS transducer package according to an embodiment of the present disclosure, mounted for a bottom-port configuration.

FIG. 3a shows an example of a MEMS transducer package 1 which is mounted in what may be referred to as a bottom port mounted configuration, whereby sound is received from a bottom side of the MEMS transducer package, the bottom side of the MEMS transducer package being the side which faces the substrate 30, and which may comprise solder pads 32a and solder 32b for electrical connection to electrical conductors on the host substrate 30.

In the bottom port mounted configuration, the MEMS transducer package 1 is for use with a host substrate 30 that comprises an opening 36 for allowing acoustic signals to reach the transducer element 13, from a bottom side of the host substrate 30.

In the example of FIG. 3a, the MEMS transducer package 1 comprises an acoustic seal ring 31 which is structured to provide a seal between an opening in the acoustic die channel 15 and the transducer element 13. As may be seen more clearly in the perspective view of FIG. 3b, the acoustic seal 31 in this example, encloses the transducer element 13 separately from the opening of the acoustic die channel 15. As such, the transducer element 13 is configured to receive acoustic signals via the aperture 36 in the host substrate 30 and to be acoustically isolated from any acoustic signal in the acoustic channel.

In another example, the acoustic seal 31 of FIG. 3a may be structured such that there is no seal between the acoustic die channel 15 and transducer element 13 (i.e. such that the acoustic seal 31 is similar to that of FIGS. 2a, 2b and 2c). In such an example, the transducer element 13 receives acoustic signals via the opening 36 in the host substrate 30, and via the acoustic die channel 15. Such an embodiment provides for the acoustic addition of the two acoustic signals and may be used for a directional microphone.

Figure 3B:
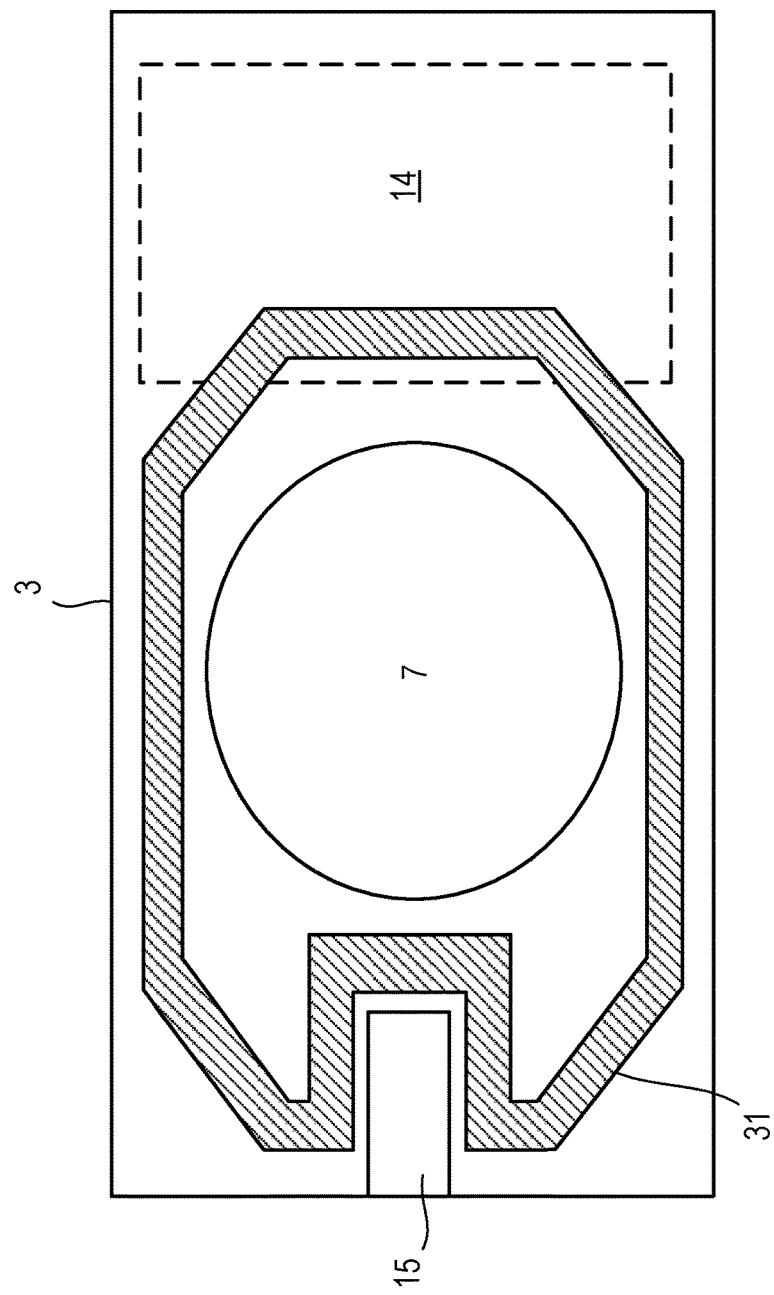

Thus, it can be seen from the above that the same transducer package 1 may be used in a number of different configurations, including a side port configuration such as that illustrated in FIGS. 2a to 2c or in a bottom port configuration as illustrated in FIGS. 3a and 3b.

As mentioned above, the acoustic seal 31 of any of the embodiments described herein, may comprises a conductive portion, for example made of solder, which can function to both connect the MEMS transducer package to a substrate, for example using a solder reflow process, and to provide an electrical connection, for example a ground connection, between the MEMS transducer package 1 and a substrate. The acoustic seal 31 may also comprise a resilient material, for example made from a rubber or silicon material, or some other flexible or compliant material, which can help provide mechanical stress relief between the MEMS transducer package 1 and a substrate onto which the package is mounted. The acoustic seal may also be mounted on a structure which contains a buried layer of flexible material, for providing further stress relief.

In the examples described above, a cross-sectional area of the acoustic die channel 15 is substantially constant along a length of the acoustic channel. By substantially constant, it is noted that this may include the cross-sectional area narrowing slightly due to non-uniformity in etching processes.

It is noted, however, that the shape or profile of the acoustic die channel 15 may be deliberately changed or varied to suit a particular application, for example to provide a desired acoustic property, or a particular acoustic impedance or filtering characteristic. The shapes may be formed, for example, by profiling an edge of a photo resist layer through photolithography and thermal exposure.

The acoustic die channel 15 may also be formed to provide a funnel type shape between its side opening and its internal opening. The acoustic die channel 15 may be configured to comprise other shapes, such as meandering channels, for channeling the acoustic signals towards the transducer element 13.

If the acoustic channel is too narrow, it will present a high acoustic resistance or acoustic inductance. Thus the channel may be tens of microns in lateral dimensions, and may be at least 100 um in one direction (for example 250 um), or more than 10000 square microns in cross-sectional area orthogonal to the direction of air flow.

It is noted that in the examples described herein, the semiconductor die portion 3 may comprise, for example, a silicon die portion.

It is also noted that in the examples described herein, the cap portion 23 may comprise, for example, a semiconductor or silicon cap portion, or a non-silicon laminated wafer, or a molded cap wafer, or a plastic cap portion, or a film or tape layer, or any other form of material. A cap portion made from semiconductor or silicon has an advantage of allowing the cap portion to be formed using wafer-level processing techniques similar to those used for manufacturing the semiconductor die portion, which means that the entire MEMS transducer package can be manufactured and assembled at the same processing site, with the cost advantages of wafer-level batch processing and other advantages such as matching the coefficients of thermal expansion to avoid thermally induced stresses.

Labyrinth Embodiments

Figure 4:
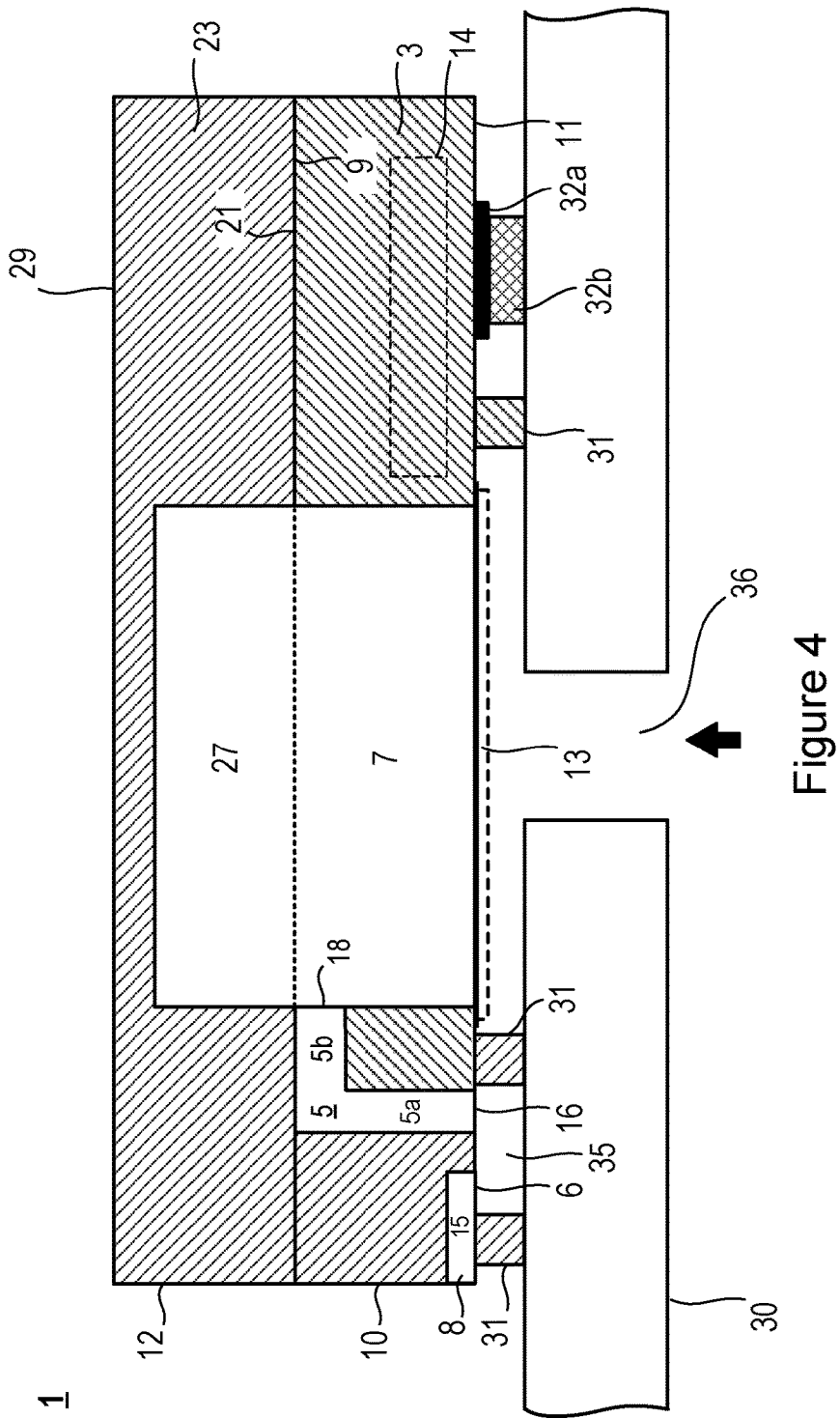
FIG. 4 illustrates a cross-sectional side view of an example of a MEMS transducer package according to an embodiment of the present disclosure.

FIG. 4 shows an example of a MEMS transducer package 1 according to another embodiment of the present disclosure. The example of FIG. 4 is similar to that of FIG. 3a, in so far as a semiconductor die portion 3 comprises a thickness bounded by a first surface 9 and an opposite second surface 11, the second surface 11 incorporating a transducer element 13 (for example a microphone comprising a membrane and back-plate). A die back volume 7 extends through the thickness of the semiconductor die portion 3 between the first surface 9 and the transducer element 13. An acoustic die channel 15 extends into the semiconductor die portion 3 between the second surface 11 and a side surface 10 of the semiconductor die portion 3.

In the example of FIG. 4 the semiconductor die portion 3 comprises a second acoustic channel 5. The second acoustic channel 5 is configured to provide an acoustic path between a third opening 16 in the second surface 11 of the semiconductor die portion 3 and a fourth opening 18 that is in acoustic connection with the die back volume 7.

In the example of FIG. 4, the second acoustic channel 5 comprises a first portion 5a which extends between the first surface 9 and the second surface 11 of the semiconductor die portion 3, and a second portion 5b which extends substantially orthogonal to the first portion 5a. The first portion 5a and the second portion 5b cooperate to provide an acoustic path between the third opening 16 in the second surface 11 of the semiconductor die portion 3 and the fourth opening 18 that is acoustically coupled to the die back volume 7.

The MEMS transducer package 1 may be mounted on a host substrate 30 comprising an aperture 36, which functions as a bottom port to allow sound or pressure waves to be received by the transducer element 13. The transducer package may further comprise an acoustic seal structure 31 for coupling the MEMS transducer package 1 to the host substrate 30. In the example of FIG. 4 the acoustic seal structure 31 is configured similar to that of FIG. 3b above, such that a first opening 6 formed by the acoustic die channel 15 and a third opening 16 formed by the second acoustic channel 5 lie between a first seal boundary, and the transducer element 13 a second seal boundary.

Therefore, in use, the transducer element 13 of the example of FIG. 4 will receive first acoustic signals on its front side via the bottom port 36 of the substrate 30, and second acoustic signals via the fourth opening 18 (i.e. via the side port formed from the second opening 8 to the fourth opening 18 via the acoustic die channel 15, sealed volume 35, and the second acoustic channel 5). The acoustic channels 15, 5 act as a tortuous path so as to delay the second acoustic signals compared to the first acoustic signals, thereby enabling the MEMS transducer package 1 to provide directivity to a received acoustic signal. The labyrinth, i.e. tortuous, acoustic channel (i.e. acoustic path provided via the acoustic channels 15, 5) may also be used to tune the resonance of the channel acoustic impedance with the acoustic capacitance of the back volume. Another possible use is that of a low-pass function of the labyrinth acoustic channel, possibly coupled directly to the back volume 7, for preventing low frequencies, for example wind noise, into the back volume thereby providing some passive wind noise rejection.

In the example of FIG. 4, it can be seen that the acoustic channels are provided entirely within the semiconductor die portion 3. In particular, the second opening 8 is formed entirely in a side surface 10 of the semiconductor die portion 3. The fourth opening 18 is formed such that the second acoustic channel 5 is acoustically coupled directly to the die back volume 7. In the embodiment of FIG. 4 the fourth opening 18 is wholly formed in a side surface of the semiconductor die portion which opens into the die back volume 7.

Figure 5:
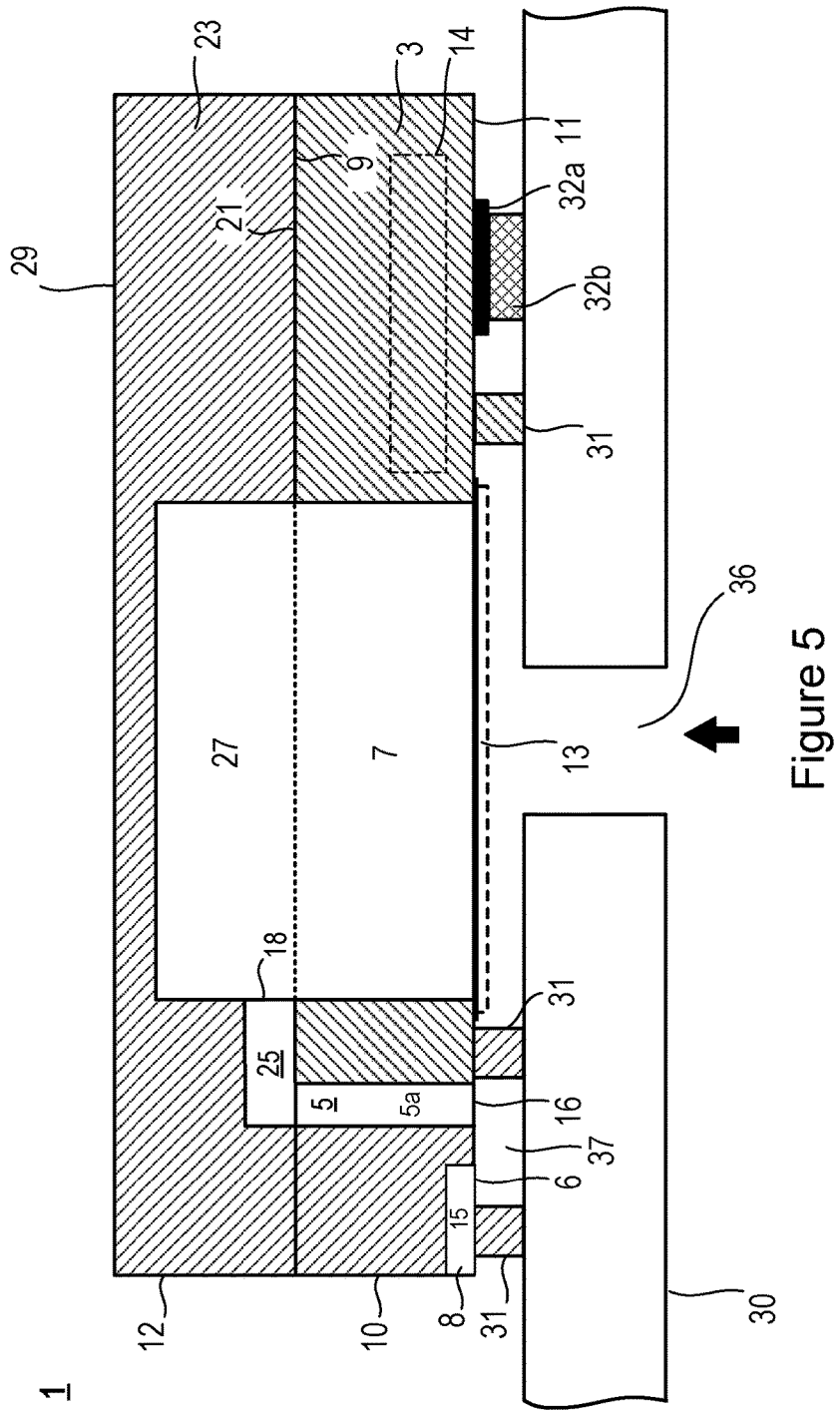
FIG. 5 illustrates a cross-sectional side view of an example of a MEMS transducer package according to an embodiment of the present disclosure.

It is noted that the acoustic channels for providing the second acoustic signals may be formed in other ways. For example, FIG. 5 shows an example similar to FIG. 4, but wherein the semiconductor die portion 3 comprises an acoustic die channel 15, but wherein the second acoustic channel is formed in the cap portion 23. In this embodiment the second acoustic channel comprises a first portion 5a which extends between the first surface 9 and the second surface 11 of the semiconductor die portion 3, and a second portion 25 formed in the cap portion 23, the second portion 25 extending substantially orthogonal to the first portion 5a. The second portion 25 may be etched in the second surface of the cap portion 23, for example while etching a cap back volume 27. The first portion 5a and the second portion 25 of the second acoustic channel cooperate to provide an acoustic path between the third opening 16 in the second surface 11 of the semiconductor die portion 3 and the fourth opening 18 that is acoustically coupled to the die back volume 7 (in this embodiment via the cap back volume 27). In the embodiment of FIG. 5 the fourth opening 18 is partly wholly in a side surface of the cap portion which opens into the cap back volume 27.

Figure 6:
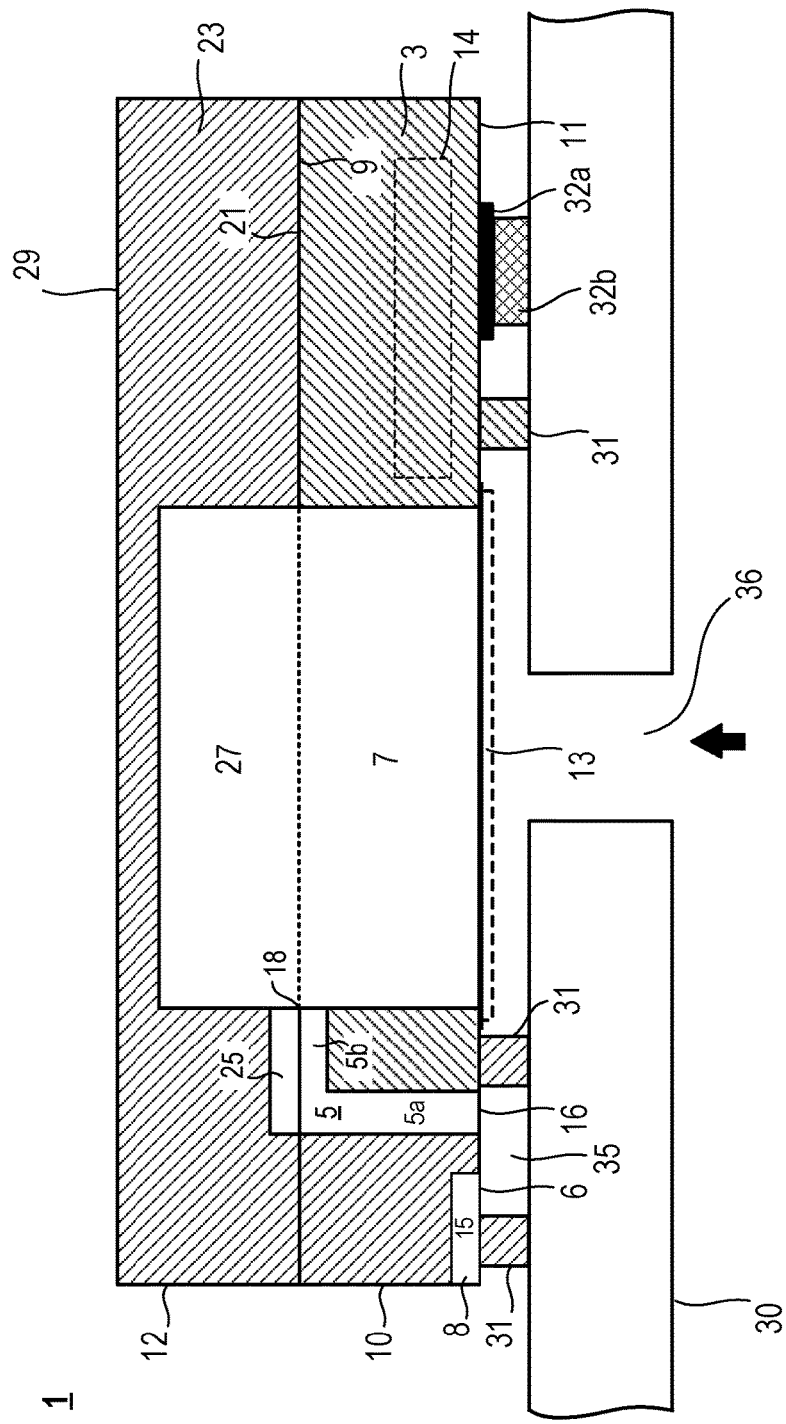
FIG. 6 illustrates a cross-sectional side view of an example of a MEMS transducer package according to an embodiment of the present disclosure.

FIG. 6 shows another example similar to FIG. 4, but wherein the semiconductor die portion 3 comprises an acoustic die channel 15, but wherein the second acoustic channel is formed partly in the semiconductor die portion 3 and partly in the cap portion 23. In this embodiment the second acoustic channel comprises a first portion 5a which extends between the first surface 9 and the second surface 11 of the semiconductor die portion 3, and a second portion 5b/25. The second portion is partly formed in the cap portion 23 and partly in the semiconductor die portion 3. The second portion 5b/25 extends substantially orthogonal to the first portion 5a. The first portion 5a and the second portion 5b/25 of the second acoustic channel cooperate to provide an acoustic path between the third opening 16 in the second surface 11 of the semiconductor die portion 3 and the fourth opening 18 that is acoustically coupled to the die back volume 7 (in this embodiment partly via the cap back volume 27). In the embodiment of FIG. 6 the fourth opening 18 is partly formed in a side surface of the cap portion 23 which opens into the cap back volume 27, and partly formed in a side surface of the semiconductor die portion which opens into the die back volume 7.

Thin Film Cap

Figure 7:
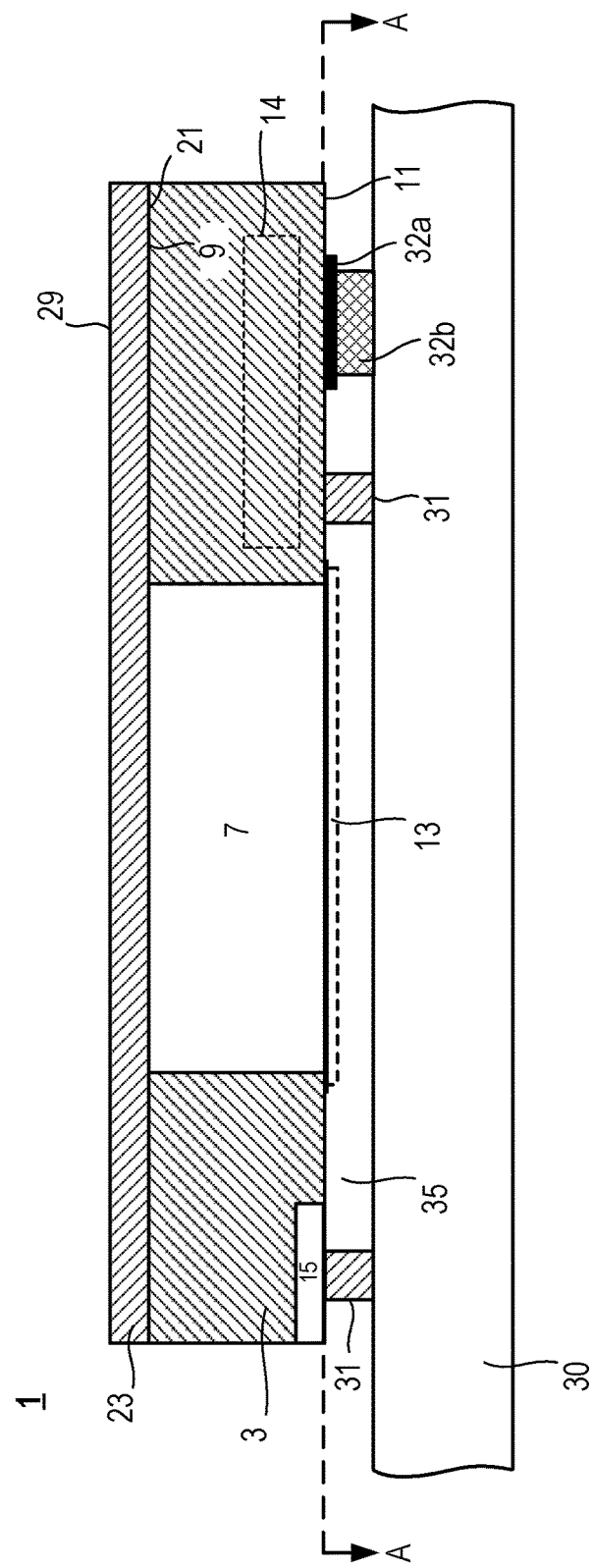
FIG. 7 illustrates a cross-sectional side view of an example of a MEMS transducer package according to an embodiment of the present disclosure.

Referring to FIG. 7, according to one embodiment, the cap portion 23 comprises a thin film or tape. This film may be a die attach film (DAF) which may be elastic and may be stretched during the package singulation process to assist the separation of the structures. Alternatively it may be some other suitable film or tape material. This embodiment, although not having a cap back volume, has the advantage of providing a low cost MEMS transducer package. Such an embodiment may be used, for example, where low cost microphone devices are required, or where the size of a back volume is not a significant factor on the operation of the MEMS transducer, or for space-sensitive applications where the reduced overall height is important. A cap portion of this tape/film type may be used with any of the other embodiments described herein.

Stepped Back Volumes

Figure 8:
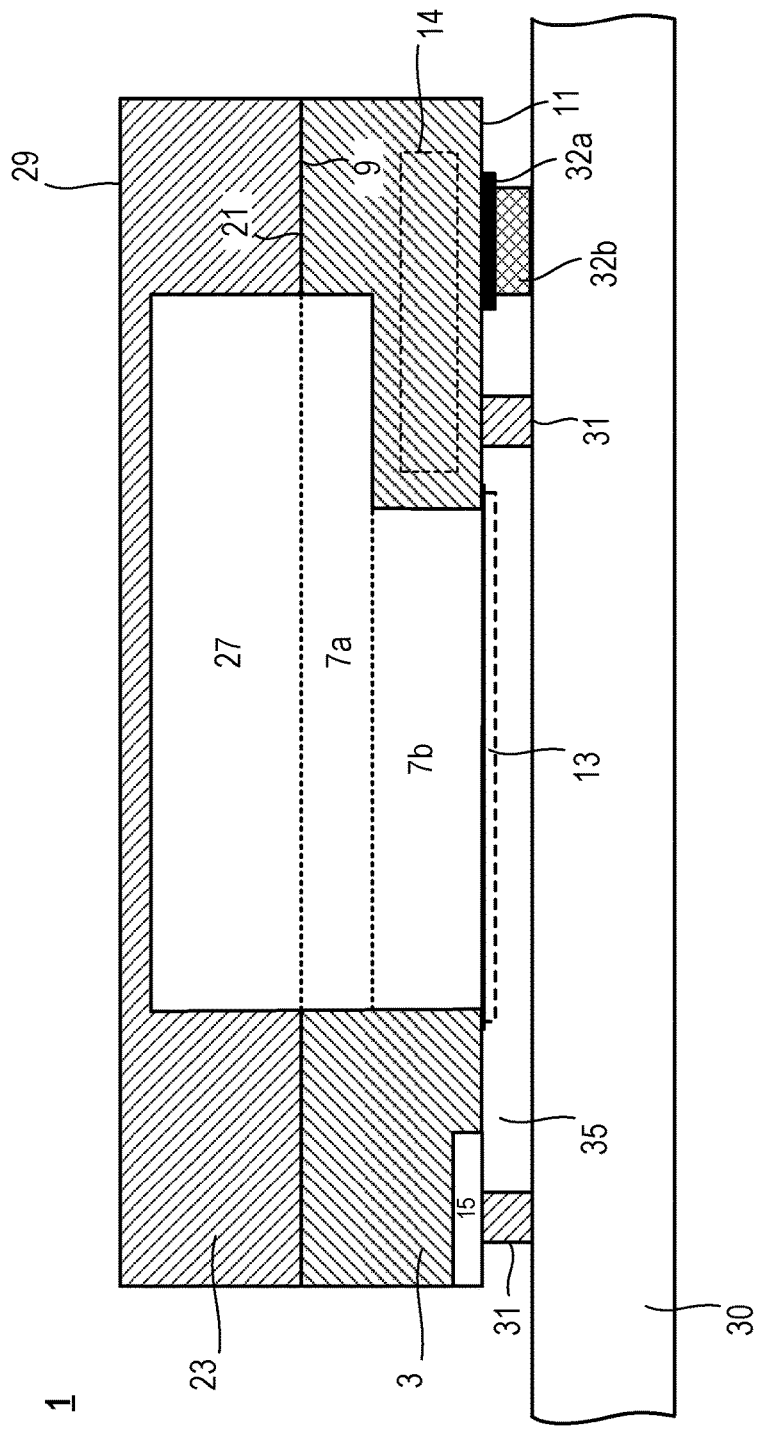
FIG. 8 illustrates a cross-sectional side view of an example of a MEMS transducer package according to an embodiment of the present disclosure.

Referring to FIG. 8, according to one embodiment, a die back volume 7 comprises a stepped back volume 7a/7b. For example, the stepped back volume may comprise at least one discontinuity along a sidewall of the stepped back volume, between the first surface 9 and the second surface 11 of the semiconductor die portion 3.

In one example, the stepped back volume comprises a first sub-volume 7a adjacent to the first surface 9 of the semiconductor die portion 3 and a second sub-volume 7b adjacent to the transducer 13. The first and second sub-volumes 7a, 7b may abut as shown (that is to form a single back volume). A lateral dimension of the first sub-volume 7a may be greater than a corresponding lateral dimension of the second sub-volume 7b. The lateral dimension of the second sub-volume may correspond to that of the transducer 13, whereas the lateral dimension of the first sub-volume is not so constrained.

In one example, a cross-sectional area of the die back volume 7 and a cross-sectional area of the cap back volume 27 are substantially the same at a plane where they meet. In other examples, a cross-sectional area of the die back volume 7 is smaller than the cross-sectional area of the cap back volume 27 at a plane where they meet. In other examples a cross-sectional area of the die back volume 7 is greater than the cross-sectional area of the cap back volume 27 at a plane where they meet.

Although the embodiment of FIG. 8 shows the stepped sidewall extending in one lateral direction, it is noted that the stepped sidewall may also extend in another lateral direction.

Furthermore, although the respective sub-volumes are shown as comprising sidewalls that are substantially orthogonal to the first surface 9 of the semiconductor die portion 3, it is noted that the sidewalls of any sub-volume portion may be sloped with respect to the first surface 9 of the semiconductor die portion 3.

The use of a stepped back volume thus has an advantage of enabling the overall volume of the back volume to be increased for a given thickness between the first surface 9 and second surface 11 for a given size of transducer. It is noted that one or more further stepped portions may be provided.

It is noted that a cap portion 23, when comprising a cap back volume 27, may also comprise a stepped cap back volume 27. The stepped cap back volume 27 of the cap portion 23 may comprise any of the characteristics noted above relating to the sub-volumes 7a and 7b of the stepped die back volume 7. In an embodiment having a molded cap portion, this may provide a greater design freedom compared to a silicon cap portion.

It is noted that a stepped die back volume and stepped cap back volume may be used in any of the embodiments described herein that comprise a back volume.

Integrated Electronics

In some embodiments, the semiconductor die portion 3 may comprise integrated electronic circuitry 14 for operating the MEMS transducer element 13. In one example, at least part of the integrated electronic circuitry 14 may be positioned in a thickness of the semiconductor die portion 3 bounded by at least part of a first sub-volume 7a of the stepped die back volume and the second surface 11 of the semiconductor die portion 3, as illustrated by the dotted lines in FIG. 8. In an embodiment comprising integrated electronic circuitry 14, the semiconductor die portion 3 may further comprise one or more lead pads 32a and solder 32b, for providing electrical connection between the integrated electronic circuitry and other electronic circuitry external to the MEMS transducer package.

In one embodiment, there is provided a MEMS transducer package comprising: a semiconductor die element 3; and a cap element 23; wherein the semiconductor die element 3 and cap element 23 have mating surfaces 9, 21; wherein the semiconductor die element 3 and cap element 23 are configured such that when the semiconductor die element 3 and cap element 4 are conjoined: a first volume is formed through the semiconductor die element 3 and into the semiconductor cap element 23; and an acoustic channel is formed to provide an opening between a non-mating surface 11 of the semiconductor die element 3 and a side surface 10 of the semiconductor die element 3.

According to another embodiment, there is provided a MEMS transducer package 1 comprising: a semiconductor die portion 3 having a thickness bounded by a first surface 9 and an opposite second surface 11; a transducer element 13 incorporated in the second surface; a die back volume 7 that extends through the thickness of the semiconductor die portion 3 between the first surface 9 and the transducer element 13; wherein an acoustic die channel 15 is formed in the second surface 11 of the semiconductor die portion 3, wherein the acoustic die channel 15 forms an opening in the second surface 11 which runs from a boundary of the second surface 11 to within the boundary of the second surface 11.

According to another embodiment there is provided a method of fabricating a MEMS transducer package 1 comprising a semiconductor die portion 3 having a thickness bounded by a first surface 9 and an opposite second surface 11, the method comprising; forming a transducer element 13 in the second surface 11; etching from the side of the first surface 9 a die back volume 7 that extends through the thickness of the semiconductor die portion 3 between the first surface 9 and the transducer element 13; and etching from the second surface 11 an acoustic die channel 15 that extends into the thickness of the semiconductor die portion 3 to form a channel that extends from a side surface 10 of the semiconductor die portion 3 into the body of the semiconductor die portion 3.

It is noted that features from any one of the embodiments above may be combined with features from any one or more of the other embodiments.

Furthermore, it is noted that where a reference is made in an embodiment to a single acoustic channel, it is noted that multiple acoustic channels may be provided to perform a similar function. By way of one example, in the embodiment of FIG. 2a, a second acoustic die channel 15 (or additional acoustic channels) may be provided between the second surface 11 and the side surface 10, or between the second surface 11 and any other side surface of the semiconductor die portion 3.

With such different embodiments, a seal structure 31 may be adapted to seal the respective acoustic channel(s) according to where the side ports are formed.

In some of the embodiments described herein, the acoustic channel is provided as the main or primary (or only) acoustic path to the transducer element. In some of the embodiments described herein, the acoustic channel is provided in combination with a back volume which is sealed towards a back side of the transducer element.

In the embodiments described above it is noted that references to a transducer element may comprise various forms of transducer element. For example, a transducer element may comprise a single membrane and back-plate combination. In another example a transducer element comprises a plurality of individual transducers, for example multiple membrane/back-plate combinations. The individual transducers of a transducer element may be similar, or configured differently such that they respond to acoustic signals differently. A transducer element may also comprises different individual transducers positioned to receive acoustic signals from different acoustic channels.

It is noted that in the embodiments described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. However, it is noted that the embodiments are also intended to embrace the output signal being derived by monitoring piezo-resistive or piezo-electric elements. The embodiments are also intended embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It is also noted that one or more further portions may be added to an embodiment described above, i.e. in addition to the die portion 3 and cap portion 23. Such a portion, if present, may comprise an acoustic channel which cooperates with an acoustic channel(s) in the die portion and/or cap portion, to provide a desired sound port. For example, in an example where a die portion is provided to incorporate a transducer element, an integrated circuit portion to incorporate an integrated circuit, and a cap portion to form a cap, one or more of these portions may comprise acoustic channel(s) to provide a sound port as described herein.

It should be noted that the above-mentioned embodiments illustrate rather than limit the disclosure, and that those skilled in the art will be able to design many alternative embodiments without departing from the scope of the appended claims. The word "comprising" does not exclude the presence of elements or steps other than those listed in a claim, "a" or "an" does not exclude a plurality, "or" does not exclude "and", and a single processor or other unit may fulfil the functions of several units recited in the claims. Any reference signs in the claims shall not be construed so as to limit their scope.

The invention claimed is:

1. A MEMS transducer package comprising:
a semiconductor die portion having a thickness bounded by a first surface and an opposite second surface;
a transducer element incorporated in the second surface;
a die back volume that extends through the thickness of the semiconductor die portion between the first surface and the transducer element; and
an acoustic die channel that extends into the semiconductor die portion between the second surface and a side surface of the semiconductor die portion.

2. A MEMS transducer package as claimed in claim 1, wherein acoustic die channel forms a channel in the second surface of the semiconductor die portion, wherein the channel extends inwardly from an opening formed by the channel in the side surface of the semiconductor die portion.

3. A MEMS transducer package as claimed in claim 1, wherein the acoustic die channel breaches the second surface and the side surface of the semiconductor die portion to form openings therein.

4. A MEMS transducer package as claimed in claim 1, wherein the opening formed in the second surface and the opening formed in the side surface combine to form an opening which spans an intersection of the second surface and side surface.

5. A MEMS transducer package as claimed in claim 1, further comprising an acoustic seal formed on the second surface of the semiconductor die portion; wherein the acoustic seal is configured to channel acoustic signals, during use, from an opening in the side surface of the MEMS transducer package to the transducer element.

6. A MEMS transducer package as claimed in claim 5, wherein the acoustic seal comprises one or more of the following features or properties:
a solder ring, for coupling with a corresponding solder ring on a substrate onto which the MEMS transducer package is to be mounted during use;
a conductive material;
a non-conductive material;
a resilient material;
a flexible material; or
a stress relieving material.

7. A MEMS transducer package as claimed in claim 1, further comprising a cap portion that abuts the semiconductor die portion.

8. A MEMS transducer package as claimed in claim 7, wherein the cap portion comprises a thickness bounded by a first surface and a second surface, and wherein the cap portion comprises a cap back volume, the cap back volume extending from the second surface of the cap portion partially into the thickness of the cap portion.

9. A MEMS transducer package as claimed in claim 7, wherein a footprint of a cap portion is the same size as the footprint of the semiconductor die portion.

10. A MEMS transducer package as claimed in claim 8, wherein a lateral dimension of the die back volume and a lateral dimension of the cap back volume are the same size at a plane where they meet.

11. A MEMS transducer package as claimed in claim 8, wherein the cap back volume comprises a stepped back volume.

12. A MEMS transducer package as claimed in claim 1, wherein the semiconductor die portion further comprises integrated electronic circuitry for operating the MEMS transducer element.

13. A MEMS transducer package as claimed in claim 12, wherein at least part of the integrated electronic circuitry is positioned in a thickness of the semiconductor die portion that is bounded by at least part of a first sub-volume of a stepped die back volume and a second surface of the semiconductor die portion.

14. A MEMS transducer package as claimed in claim 1, further comprising a second acoustic channel.

15. A MEMS transducer package as claimed in claim 14 wherein the second acoustic channel is configured to provide an acoustic path between a third opening in the second surface of the semiconductor die portion and a fourth opening that is in acoustic connection with the die back volume.

16. A MEMS transducer package as claimed in claim 15, wherein the second acoustic channel comprises a first portion which extends between the first surface and the second surface of the semiconductor die portion, and a second portion which extends orthogonal to the first portion, and wherein the first portion and the second portion cooperate to provide an acoustic path between the third opening in the second surface of the semiconductor die portion and the fourth opening that is acoustically coupled to the die back volume.

17. A MEMS transducer package as claimed in claim 16, wherein the fourth opening is formed either entirely in direct acoustic connection with the cap back volume of the cap portion, or partly in direct acoustic connection with the cap back volume of the cap portion and partly in direct acoustic connection with the die back volume of the semiconductor die portion, or entirely in direct acoustic connection with the die back volume of the semiconductor die portion.

18. A MEMS transducer package as claimed in claim 1, wherein the transducer element comprises a microphone, or multiple microphones, or where the transducer element comprises a membrane and back-plate, or multiple membranes and back-plates.

19. A MEMS transducer package comprising:
  a semiconductor die portion having a thickness bounded by a first surface and an opposite second surface;
  a transducer element incorporated in the second surface;
  a die back volume that extends through the thickness of the semiconductor die portion between the first surface and the transducer element;
  wherein an acoustic die channel is formed in the second surface of the semiconductor die portion, wherein the acoustic die channel forms an opening in the second surface which runs from a boundary of the second surface to within the boundary of the second surface.

20. A method of fabricating a MEMS transducer package comprising a semiconductor die portion having a thickness bounded by a first surface and an opposite second surface, the method comprising;
  forming a transducer element in the second surface;
  etching from the side of the first surface a die back volume that extends through the thickness of the semiconductor die portion between the first surface and the transducer element; and
  etching from the second surface an acoustic die channel that extends into the thickness of the semiconductor die portion to form a channel that extends from a side surface of the semiconductor die portion into the body of the semiconductor die portion.

* * * * *